United States Patent [19]

Dackow

[11] Patent Number: 4,546,487

[45] Date of Patent: Oct. 8, 1985

[54] AUTO RANGING COUNTER

[75] Inventor: Paul N. Dackow, Hillsborough Township, Somerset County, N.J.

[73] Assignee: RCA Corporation, Princeton, N.J.

[21] Appl. No.: 567,336

[22] Filed: Dec. 30, 1983

[51] Int. Cl.[4] ............................................. H03K 21/34
[52] U.S. Cl. ........................................ 377/51; 377/20; 377/44
[58] Field of Search ........................ 377/51, 20, 44, 52

[56] References Cited

U.S. PATENT DOCUMENTS

| | | | |
|---|---|---|---|
| 3,413,449 | 11/1968 | Brown | 377/51 |
| 4,066,875 | 1/1978 | Ollington et al. | 377/51 |
| 4,079,315 | 3/1978 | Mohr | 377/20 |
| 4,203,030 | 5/1980 | Moran | 377/44 |

*Primary Examiner*—John S. Heyman
*Attorney, Agent, or Firm*—Joseph S. Tripoli; George E. Haas; Henry I. Schanzer

[57] ABSTRACT

At the inception of a time interval whose duration is to be measured, pulses whose rate may be varied are applied to a first counter. A second counter controls the rate of the pulses applied to the first counter. An overflow sensing circuit is connected to the output of the first counter for, in response to each overflow signal at the output of the first counter, incrementing the second counter which then causes pulses having a new rate to be applied to the first counter and for, concurrently, presetting the counter to a new count. The new rate is equal to 1/N the old rate and the new count is equal to 1/N the count in the first control prior to the overflow. The elapsed time information in the circuit is therefore always valid.

9 Claims, 3 Drawing Figures

AUTO RANGING COUNTER

This invention relates to pulse counting means and more particularly to auto ranging counting means.

In many systems it is necessary to measure the elapsed time (or time interval) between two events. A known method of measuring the time interval between two events includes the application of pulses having a known rate or frequency, ($f_k$), to a counter during the interval. The total number of pulses accumulated in the counter indicates the time interval since the product of the count and the known period $T_k$ of each count, where $T_k$ is equal to $1/f_k$, equals the elapsed time. In the design of a counting system, the minimum value selected for the frequency, $f_k$, is based on the required resolution, or accuracy, of the system for the shortest interval to be measured. For example, where the shortest interval to be measured is 16 microseconds and it is desired that the resolution be within 1 microsecond, the frequency $f_k$ should be a minimum of 1 MHZ. (The resolution of the system is then essentially one out of 16 counts which corresponds to an accuracy of approximately 6.6%). A significant disadvantage of this system occurs where the time interval to be measured varies over a wide range (e.g. 16 microseconds to 10 milliseconds). The problem is that the frequency ($f_k$) needed to accurately sense the shortest interval, results in the accumulation of many counts when used to measure the longest interval. For example, where $f_k$ is equal to 1 MHZ and the time interval is 10 milliseconds, 10,000 counts have to be stored, necessitating a 14 bit counter.

The need for counters having a large number of stages is reduced using auto ranging counting circuits. A known auto ranging circuit includes means for applying pulses whose frequency is to be determined to a relatively small counter for fixed (known) time intervals. The output of the counter is monitored to sense whether an overflow condition occurs. If an overflow occurs, the counter is reset and the pulses are measured for a second, shorter, known time interval. The process of sensing an overflow and decreasing the time interval is repeated until the counter no longer overflows. The "right" frequency range is thus obtained and, then, the frequency of the input signal may be determined.

A problem with this known auto ranging circuit is that the information accumulated prior to the overflow is lost. Thus, where the original information is not constant, repetitive, or reproducible, significant prior information is lost each time the counter overflows. Furthermore, since the time measurement is done in a serial manner, much time may be wasted until the right range is found and a correct measurement may be made.

This problem is resolved in circuits embodying the invention by maintaining the validity of the elapsed time information within the system and thereby preventing the loss of this information.

Circuits embodying the invention include counting means and means for applying pulses having a selectable frequency (or rate) to the counting means upon the initiation of a time interval measurement. Overflow sensing means are coupled to an output of the counting means for sensing whether an overflow occurs. In response to an overflow condition, the sensing means causes pulses having a new rate to be applied to the counting means and concurrently causes the counting means to be set to a new count. The new rate is equal to 1/N the rate of the pulses applied to the counter prior to its overflow, and the new count is equal to 1/N the count in the counting means prior to its overflow; where N is a number greater than 1. The combination of the new count in the counting means and the new rate of the pulses applied to the counting means provides a continuously correct indication of the time that has elapsed since the beginning of the time interval measurement. Therefore in circuits embodying the invention the information in the counting means is always valid.

In the accompanying drawings like reference characters denote like components; and FIG. 1 is a block diagram of a circuit embodying the invention;

Figure 1:
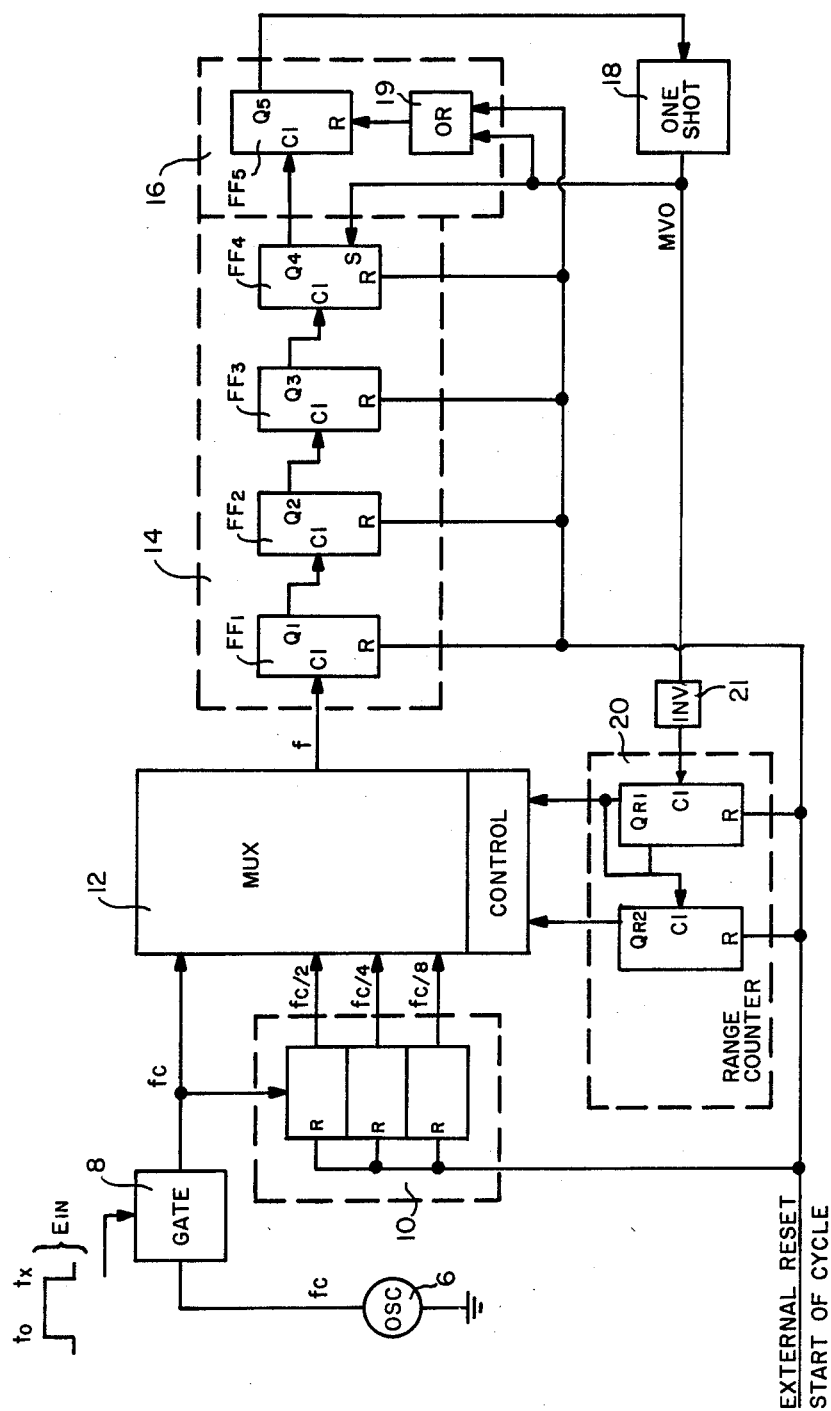

The circuit of FIG. 1 includes an oscillator 6 having an output at which are produced pulses of fixed rate, fc, which in the discussion to follow is assumed to be equal to 1 MHZ, or $10^6$ pulses per second (PPS). The oscillator 6 may be, for example, a source of frequency signals of the type shown in ICAN 6086 published by RCA Corp. However, any suitable oscillator or time base circuit may be used. The output of oscillator 6 is coupled via a selectively enabled gating circuit 8 to the clock input of a prescaler 10 and to one input of a multiplexer 12.

Gating circuit 8 may be, for example, an AND gate similar schematically to the CD4081 manufactured by RCA Corp. However, any gating circuit which can be controlled to selectively inhibit, or pass, the fc signal may be used. Multiplexer 12 may be, for example, a circuit similar, schematically, to the CD4051 manufactured by RCA Corp. However, any circuit having a sufficient number (e.g., 4) of inputs and an output, and which may be controlled to pass the signals present at a selected one of its inputs to its output may be used instead. Prescaler 10, is a ripple carry binary counter, functioning as a frequency divider, which, in response to the application of an fc signal at its input, produces pulses of frequency fc/2, fc/4 and fc/8, respectively, at its three succeeding outputs. The fc signal and the three outputs of prescaler 10 are applied to multiplexer 12 which under the control of a range counter 20 transmits only a selected one of these 4 signals to its output. In general, the frequency or rate (f) of the pulses produced at the output of multiplexer 12 may be expressed as $fc/2^i$ where i, as discussed below, corresponds to the count in counter 20 or to the number of overflow pulses applied to counter 20.

The signal (f) at the output of multiplexer 12 is applied to the clock (or pulse) input of a basic 4-stage ripple binary counter 14. The size (i.e. the number of stages) of counter 14 is dictated by the highest resolution needed and/or desired for proper system operation. Where, as discussed above, the shortest time interval to be measured is in the order of 16 microseconds and the resolution of any interval is to be measured to an accuracy of one count out of 16, the basic counter 14 can be a four stage counter.

For ease of the explanation to follow, counter 14 is shown to be comprised of 4 flip-flops (FF1, FF2, FF3 and FF4) each one having an output (Q1, Q2, Q3 and Q4) which is used to toggle the next higher order stage. Each stage includes a reset input (R) which in response to a high signal causes its Q output to go low. As detailed below, FF4 differs from the other flip-flops of counter 14 in that means are provided for independently setting FF4 from the output (MVO) of a one-shot multivibrator 18, in addition to FF4 being toggled by Q3 of FF3.

The output (Q4) of counter 14 is applied to the clock input of an overflow sensor 16 comprised of a flip-flop, FF5, which may be, for example, similar to the CD4013 manufactured by RCA Corp. The output, Q5, of FF5 is applied to one-shot multivibrator 18. In this design one-shot 18 is triggered on the low-to-high transition at the output Q5 of FF5. One shot 18 may be, for example, a multivibrator similar to the CD4098B manufactured by RCA Corp. When multivibrator 18 is triggered by a positive pulse at its input, it produces a positive going pulse, MVO, at its output. The pulse width of MVO should be less than 1/fc. The pulse width of MVO is not otherwise critical, although it is preferable that it be as short as possible.

The output (MVO) of one shot 18 is applied to one input of OR gate 19 for resetting FF5 and causing Q5 to go from high-to-low when MVO goes high. The output (MVO) is also applied to a set input of FF4 in counter 14 to cause (i.e., set) the output (Q4) of FF4 to go from low-to-high when MVO goes high. MVO is also applied to range counter 20 via inverter 21 causing it to be incremented by one count each time an MVO pulse is produced. Inverter 21 is needed because it is assumed that counter 20 is incremented on the negative going transition of the input pulse to counter 20.

Range counter 20 is a two stage counter each stage of which is similar schematically and in operation to the first three stages of counter 14. The outputs of the first and second stages of range counter 20 are denoted as QR1 and QR2, respectively. In the circuit of FIG. 1, counter 20 has four states which are used to determine, or control, which signal applied to multiplexer 12 gets applied to counter 14. Corresponding to QR1=QR2=0, the signal fc is applied to counter 14. In response to a first overflow pulse counter 20 is incremented such that QR1=1 and QR2=0 and the signal fc/2 is applied to counter 14. In response to a second overflow pulse QR1=0 and QR2=1 and the signal fc/4 is applied to counter 14. In response to a third overflow pulse QR1=QR2=1 and the signal fc/8 is applied to counter 14.

Prescaler 10, counter 14 and range counter 20 may be, for example, ripple binary counters similar schematically (but not necessarily identical) to the CD4024B manufactured by RCA Corporation. These counters may also be synchronous counters or they may be formed by combining many different types of flip-flops.

In the discussion to follow, prescaler 10, and counters 14 and 20 are assumed to be of the type whose states advance one count on the negative going transition of each input pulse at their clock (or pulse) input.

Figure 2:
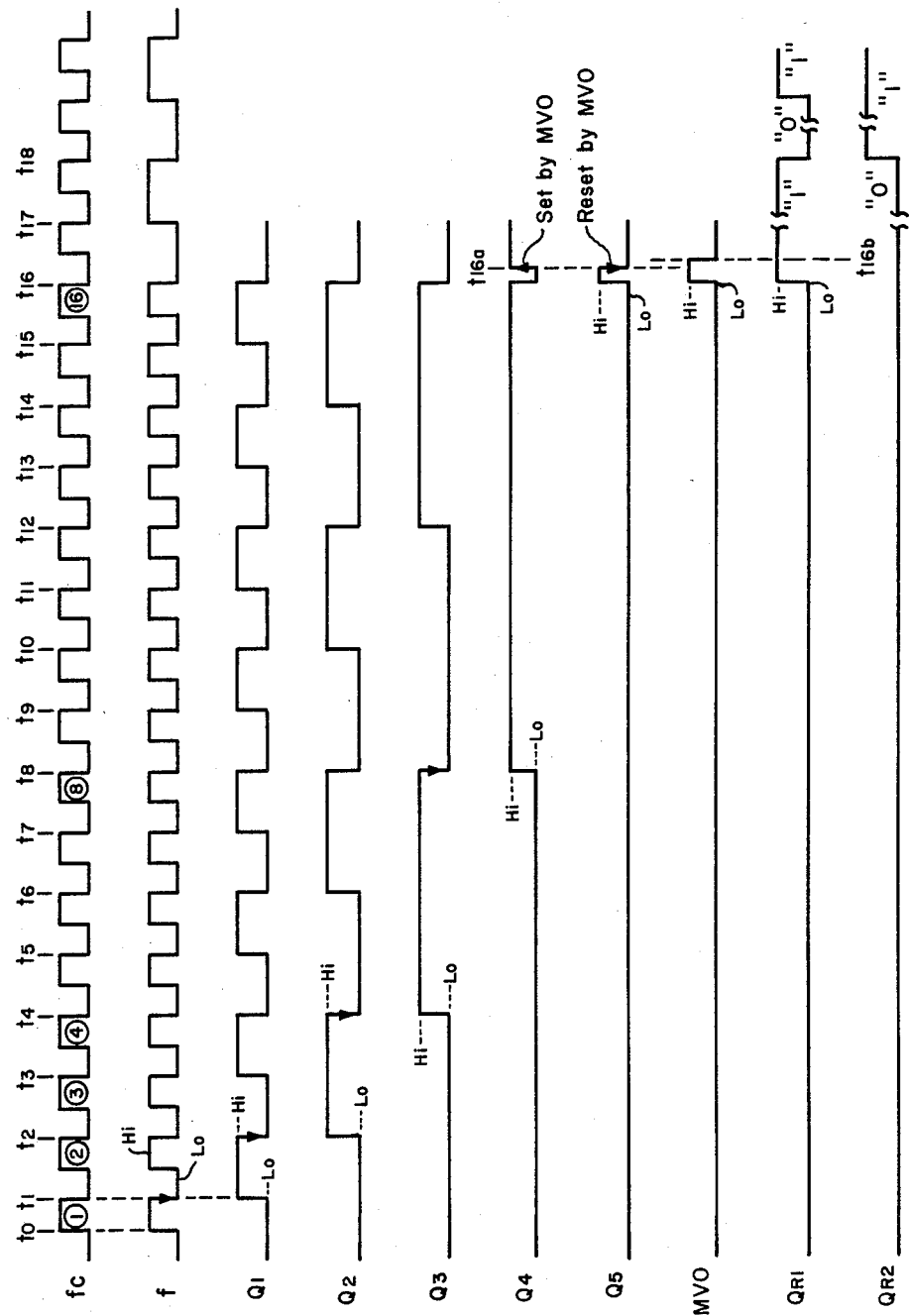
FIG. 2 is a diagram of waveforms associated with the circuit of FIG. 1.

The operation of the circuit of FIG. 1 may best be explained with reference to the waveform diagram of FIG. 2.

In the discussion to follow it is assumed that an input signal (EIN) whose width is to be measured enables gate 8 for the period of time ($t_0$ to $t_x$) that it is present.

Assume, for example, that gate 8 is enabled at time $t_o$, initiating a measuring interval, and that fc is then applied to multiplexer 12 whose output (f) is then equal to fc.

At a time, just prior to $t_o$, all the flip-flops in the circuit are reset such that their respective Q outputs are driven to their "low" state. Thus, initially the outputs Q1, Q2, Q3 and Q4 of counter 14, output Q5 of overflow sensor 16, and the outputs QR1, and QR2 of counter 20 are all "low". As noted above, counter 14 increments on the negative transition of its clock input. Thus, as shown in FIG. 2, Q1 is driven high at time $t_1$ on the negative going transition of the 1 pulse. Q2 is driven high on the negative going transition of the Q1 pulse at time $t_2$; Q3 goes high on the negative going transition of the Q2 pulse at time $t_4$; Q4 goes high on the negative going transition of the Q3 pulse at time $t_8$; and Q5 is driven from low-to-high on the negative going transition of the Q4 pulse at time $t_{16}$.

Note that immediately after the negative transition of pulse 16, at time $t_{16}$, outputs Q1, Q2, Q3 and Q4 are driven from the "high" state to the "low" state as a result of the occurrence of the 16th pulse. The negative going transition of Q4 at time $t_{16}$ causes the output Q5 of overflow counter 16 to be driven from the low level to the high level, indicative of the occurrence of an overflow condition.

As soon as Q5 goes high it triggers one-shot 18 causing its output, MVO, to be pulsed positively. When MVO goes high it causes, or does, the following:

1 Resets FF5 via OR gate 19 causing Q5 to return to the "low" level;

2 Increments range counter 20. For example, if counter 20 had been set such that QR1 and QR2 were set low, the first MVO pulse causes counter 20 to go to the condition where QR1 goes high while QR2 remains low. QR1-high and QR2-low applied to the control section of multiplexer 12 causes fc/2 to be coupled to the output (f) of multiplexer 12. The frequency (f) of the timing signal applied to counter 14 is now fc/2. Thus, each time counter 20 is incremented a new frequency (f) is selected (i.e. pulses with the new frequency are applied to counter 14) where the new frequency is ½ the applied frequency prior to counter 20 being incremented.

3 Sets FF4 of counter 14 so that at time $t_{16a}$, shortly after $t_{16}$, Q4 is set to the "high" state.

The significance of incrementing counter 20 and setting Q4 to the "high" state, as set forth in steps 2 and 3 above, is that the information previously accumulated in counter 14 regarding the length of the elapsed time is accurately preserved and counter 14 can then accumulate additional counts to extend the measurable period without loss of data.

This is best appreciated by examining the system operation for several consecutive overflow conditions. Assume, for example, that the time interval being measured extends beyond 16 microseconds. As soon as 16 microseconds have elapsed, 16 counts have been measured each having a period of 1 microsecond per count. Upon the occurrence of the 16th pulse, the basic counter 14 is preset to the count of 8 (i.e. Q4=high) and a frequency of fc/2 is applied to the counter. The rate of fc/2 is equivalent to a period of 2 microseconds per pulse or cycle. Hence presetting the counter to 8 with an input frequency of fc/2 indicates an elapsed time of 16 microseconds. Counter 14 can then count an additional 8 counts with each additional count representing an elapsed time of 2 microseconds. If an 8th additional count at a rate of fc/2 is applied to counter 14, it overflows and counter 20 is again incremented so that fc/4 is applied to counter 14 and counter 14 is again set to the count of 8. When counter 14 overflows for the second time 32 microseconds have elapsed. Presetting counter 14 to the count of 8 (Q4=high) and applying pulses having a rate of fc/4, which is equivalent to 4 microseconds per count, to counter 14 causes counter 14 to indicate an elapsed time of 32 microseconds. Thus the information in counter 14 is valid.

If the elapsed time is still being measured, counter 14, as before, may count an additional 8 counts. But each count now represents a period of 4 microseconds. If an 8th additional count corresponding to an elapsed time of 64 microseconds is applied to counter 14, it overflows and counter 20 is again incremented so that fc/8 is applied to counter 14 which is again preset to a count of 8. Since fc/8 corresponds to a period of 8 microseconds per count, the 8 counts to which counter 14 is set indicates an elapsed time of 64 microseconds. Again the elapsed time information is always valid. This process may be repeated until range counter 20 is filled up, or driven, to an all "1's" condition.

Thus, in the circuit of FIG. 1, setting the last stage (i.e. Q4) of counter 14 to the "high" condition to represent a count of 8 while concurrently applying pulse having a rate of $fc/N^i$ to counter 14 via range counter 20 functions to accurately store the previously elapsed time information and enables the counter to accumulate additional counts, where N=2, and i corresponds to the number of overflow conditions that have occurred.

It is particularly significant that, in the circuit of FIG. 1, only the last stage (e.g. Q4) of counter 14 has to be set high each time an overflow condition is sensed to maintain the validity of the elapsed time information. Hence the elapsed information in counter 14 is always valid when its contents are taken in combination with the data stored in range counter 20.

Range counter 20 is shown to have two stages. However it should be evident that range counter 20 could include many more stages. However in the circuit of FIG. 1, if the range counter is extended, the stages of prescale (frequency divider) 10 must be likewise extended to provide additional appropriate frequency signals.

An advantage of the invention is that the total number of counting stages needed to measure a wide range of elapsed times is significantly reduced. The advantage is most evident when an extremely wide range has to be measured and where the various subfrequencies (i.e. those produced by prescaler 10) are already available in other parts of the circuit or system.

Once the size of basic counter 14 is determined, the minimum size of range counter 20 will depend on the maximum time interval to be measured by the system. For an assumed fc of 1 MHZ, the combination of a 4-stage counter 14 and a 2-stage range counter 20 can provide an elapsed time measurement ranging from 0 to 128 microseconds. If range counter 20 were extended to three stages, an elapsed time measurement ranging from 0 to 2048 microseconds could be made. Similarly, if range counter 20 were extended to 4 stages, an elapsed time measurement ranging from 0 to 524,288 microseconds may be made.

In general, if range counter 20 has M binary stages it is possible to count or sense i steps or increments, where i ranges from 0 to $2^M-1$. Corresponding to each increment (i) the frequency (f) to be applied to basic counter 14 may be calculated to be $f=fc/2^i$. From this it follows that the period of each pulse, at each increment "i", is equal to $2^i/fc$. The maximum elapsed time measurable with a system of the type shown in FIG. 1 at each increment i is then $[2^R]$ times $[2^i/fc]$, where R is equal to the number of binary stages in basic counter 14.

Thus, assuming fc to be 1 MHZ and assuming a prescaler producing timing signals whose period increases by a factor of 2 at each succeeding step, a range counter 20 of just 4 binary stages in combination with a basic counter 14 of 4 stages enables the measurement of an elapsed time ranging between 0 and approximately ½ second.

For this example, ignoring the necessary control logic and assuming that the different frequencies are independently available, a system embodying the invention would require a basic counter of 4 stages and a range counter of 4 stages for a total of 8 counting stages. In comparison thereto a conventional counter would require 19 binary stages to measure a time interval of like range.

The invention provides significant advantages in a system where similar time periods have to be measured and/or compared. This is particularly so in a system where two like valued signals have to be produced or measured and where the two like valued signals may vary over a wide range. For example, two like valued signals which may range between 0 and ½ seconds would require, using conventional techniques, two 19-stage counters and 19 comparators to compare their outputs. In contrast thereto, in circuits embodying the invention (assuming an accuracy of approximately 6 percent) 2 binary counters of 4 stages each and 2 range counters of 4 stages each and 8 comparators would be needed (ignoring the control and peripheral logic).

Figure 3:
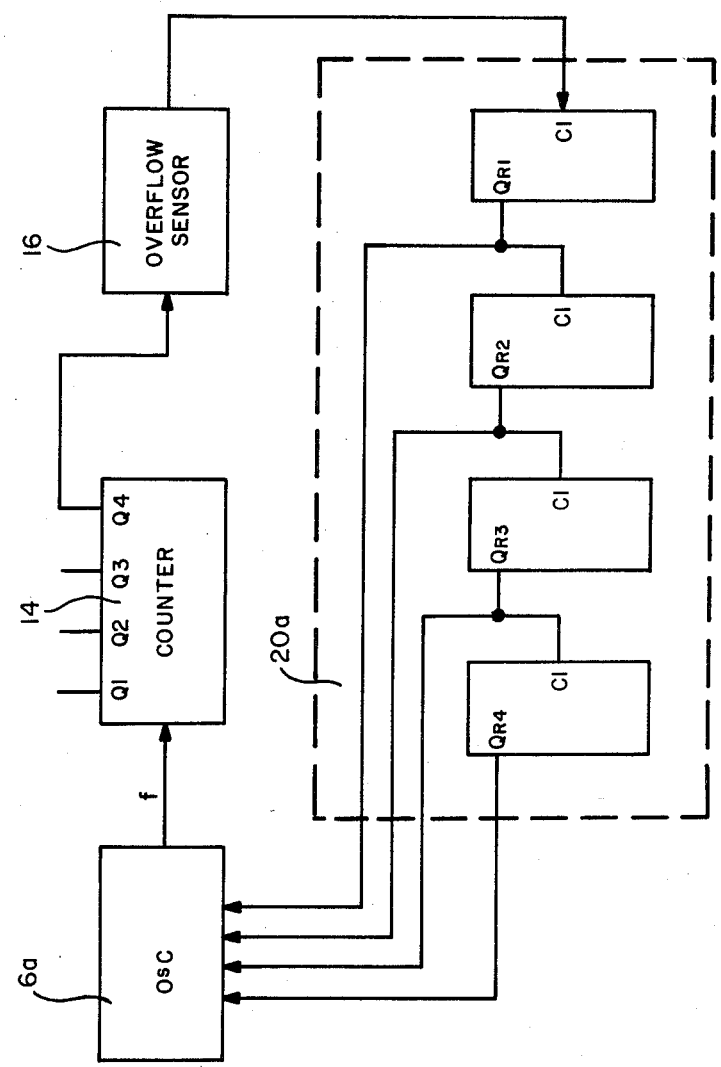
FIG. 3 is another block diagram of a circuit embodying the invention.

In the circuit of FIG. 1, discrete frequencies derived from oscillator 6 are generated by means of a frequency divider (prescaler) 10 and are applied via controllable multiplexer 12 to counter 14. However as shown in FIG. 3, a range counter 20a may be coupled to an oscillator 6a whose frequency output may be directly controlled by the range counter output. The oscillator 6a output would vary in a similar manner to the output f of multiplexer 12 in FIG. 1. Hence the operation of the system would be similar to that already described.

The counters in the above example are described as binary (÷2) stages. However it should be understood that other types of counters can also be used. For example, if a 4 stage decade (÷10) counter were used instead of the 4-bit binary counter 14, and a 3 stage decade (÷10) counter were used instead of the binary prescaler 10, then the first cycle of counter 14 could count up to 9999 at a frequency fc. The next fc pulse would increment counter 14 to 0000 causing an overflow which would set counter 14 and increment range counter 20. Range counter 20 would increment to the next frequency (fc/10), and the basic counter 14 would have to be set to the condition of 1000 counts (i.e. 1000 counts at fc/10 is equal to 10,000 counts at fc). On the next overflow (after 9000 more counts at fc/10), the counter 14 would again be set to 1000 and the frequency applied to the counter would be fc/100 (10,000 counts at fc/10 is equal to 1000 at fc/100).

If counter 14 was a decade counter (i.e. ÷10) and the prescaler divides by some multiple other than 10 (for example, ÷2), then the system could work as follows: Counter 14 would count 10,000 pulses at fc. The first overflow pulse would set counter 14 to 5000 and change the applied frequency to fc/2 (10,000 pulses at fc is equal to 5000 pulses at a rate of fc/2). The next overflow pulse causes the frequency to equal fc/4 and the count of counter 14 again to be set to 5000 (10,000 @ fc/2=5000 @ fc/4). Each time an overflow occurs the process would be repeated.

As long as on each overflow, the counter is forced to a new value that corresponds to the new frequency applied to the counter, many combinations are possible.

In the discussion above and in the appended claims the terms rate and frequency are used interchangeably.

What is claimed is:

1. The combination comprising:
   first and second counters;
   timing means for producing pulses whose frequency may be altered;
   means for selectively applying said pulses to said first counter;
   means responsive to the count in said second counter coupled to said timing means for decreasing the frequency of the pulses produced by said timing means by a factor of 1/N each time the count in said second counter increases where N is a positive integer greater than 1; and
   overflow sensing means coupled between said first and second counters responsive to an overflow signal at an output of said first counter for incrementing the count in said second counter and for presetting the count in said first counter to a new count which is equal to 1/N the count in the first counter prior to its overflow.

2. The combination as claimed in claim 1 wherein said timing means is an oscillator whose frequency is varied as a function of the value of the count in said second counter.

3. The combination as claimed in claim 1 wherein said timing means includes an oscillator, a frequency divider and a multiplexer, wherein said frequency divider has an input coupled to said oscillator and has a plurality of outputs for producing succeeding lower frequency signal, and wherein said multiplexer is coupled to the oscillator and to the frequency divider outputs and is responsive to the count in said second counter for producing pulses at its output whose rate are a function of the count in said second counter.

4. The combination as claimed in claim 2 wherein said first and second counters are binary counters.

5. The combination as claimed in claim 1 wherein said first counter includes R binary stages, where R is a positive integer greater than 1, and wherein said second counter includes M stages, where M is a positive integer greater than 1, and wherein a particular stage of said first counter is preset each time said first counter overflows and said second counter is incremented.

6. An auto-ranging counting system comprising:
   counting means adapted to received pulses;
   controllable timing means for producing at its output pulses whose rate may be altered;
   means for selectively applying said pulses to said counting means; and
   means responsive to an overflow condition at an output of said counting means for altering, in response to an overflow signal, the rate of the pulses produced by the controllable timing means, the new rate being equal to 1/N the rate of the pulses applied to the counting means immediately prior to the overflow condition, and said means responsive to an overflow condition also including means coupled to said counting means for setting, in response to an overflow signal, the count of said counting means to a value equal to 1/N the count in the counting means immediately prior to the overflow condition.

7. The auto-ranging counting system as claimed in claim 6 wherein said controllable timing means includes an oscillator producing output signals of a fixed frequency, fc, and a frequency divider circuit having an input connected to said oscillator for receiving said fixed frequency signal, said frequency divider having X succeeding outputs, each succeeding output of said frequency divider for producing an output signal whose frequency is 1/N the frequency of the preceding output; and
   wherein said controllable timing means also includes multiplexing means coupled to said oscillator and frequency divider for, in response to a control signal, producing a selected one of said frequency signals at its said output.

8. The auto ranging counter as claimed in claim 7 wherein said means responsive to an overflow condition includes a range counter responsive to an overflow at the output of said counting means, said range counter being incremented by a count each time said counting means overflows, and said range counter being coupled to said multiplexer, for, in response to each incremented condition, applying a signal to said multiplexer for selecting a succeeding, lower, frequency than the previous frequency applied to said counting means.

9. The combination comprising:
   first and second counters;
   timing means for producing pulses whose frequency may be altered;
   means for selectively applying said pulses to said first counter;
   means responsive to the count in said second counter coupled to said timing means for decreasing the frequency of the pulses produced by said timing means from a frequency $f_1$ to a frequency $f_2$ each time the count in said second counter increases; and
   overflow sensing means coupled between said first and second counters responsive to an overflow signal at an output of said first counter for incrementing the count in said second counter and for presetting the count in said first counter to a new count; where the new count times $1/f_2$ is equal to the old count times $1/f_1$.

* * * * *